United States Patent
Zia et al.

(10) Patent No.: US 7,169,654 B2
(45) Date of Patent: Jan. 30, 2007

(54) METHOD OF FORMING A SEMICONDUCTOR DEVICE

(75) Inventors: Omar Zia, Austin, TX (US); Lawrence Cary Gunn, III, Encinitas, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 199 days.

(21) Appl. No.: 10/990,215

(22) Filed: Nov. 15, 2004
(Under 37 CFR 1.47)

(65) Prior Publication Data

US 2006/0105509 A1   May 18, 2006

(51) Int. Cl.
*H01L 21/84* (2006.01)

(52) U.S. Cl. .............. 438/155; 438/236; 438/296; 438/359; 257/350; 257/E21.419

(58) Field of Classification Search ............. 438/155, 438/236, 296, 359; 257/E21.419
See application file for complete search history.

(56) References Cited

U.S. PATENT DOCUMENTS

| | | | | |
|---|---|---|---|---|
| 4,309,812 A | * | 1/1982 | Horng et al. | 438/374 |
| 5,279,978 A | * | 1/1994 | See et al. | 438/154 |
| 6,004,840 A | * | 12/1999 | Kimura et al. | 438/234 |
| 6,608,945 B2 | | 8/2003 | Deliwala | |
| 6,654,511 B2 | | 11/2003 | Deliwala | |
| 6,687,446 B2 | | 2/2004 | Arakawa | |
| 7,098,090 B2 | * | 8/2006 | Zia et al. | 438/155 |

(Continued)

FOREIGN PATENT DOCUMENTS

WO   WO02/14915 A2   2/2002

(Continued)

OTHER PUBLICATIONS

Fischer et al., "0.1 dB/cm Waveguide Losses in Single-Mode SOI Rib Waveguides," IEEE Photonics Technology Letters, vol. 8, No. 5, May 1996, pp. 647-648.

*Primary Examiner*—Bradley K. Smith
*Assistant Examiner*—Steven J. Fulk
(74) *Attorney, Agent, or Firm*—Michael J. Balconi-Lamica

(57) ABSTRACT

A method of integrating a non-MOS transistor device and a CMOS electronic device on a semiconductor substrate includes forming openings within an active semiconductor layer in first and second regions of a semiconductor substrate. The first region corresponds to a non-MOS transistor device portion and the second region corresponds to a CMOS electronic device portion. The openings are formed using a dual trench process, forming openings or shallow trenches in the non-MOS transistor device portion to a first depth, and openings in the CMOS electronic device portion to a second depth greater than the first depth. The method further includes forming first and second non-MOS transistor device implant regions within the active semiconductor layer underlying the shallow trenches in the non-MOS transistor device portion, forming first and second low dose non-MOS transistor device well regions in the active semiconductor layer disposed in-between the first and second shallow trenches, forming high dose non-MOS transistor device connectivity regions, forming a salicide blocking layer overlying at least the first and second low dose non-MOS transistor device well regions, forming first and second non-MOS transistor device contact regions, and saliciding the semiconductor substrate, wherein the salicide blocking layer prevents salicidation of the first and second low dose non-MOS transistor device well regions.

24 Claims, 12 Drawing Sheets

U.S. PATENT DOCUMENTS

2002/0164122 A1  11/2002  Taylor, Jr.
2003/0063885 A1   4/2003  Gunn, III
2003/0235370 A1  12/2003  Taillaert
2005/0233508 A1* 10/2005  Ushiku ...................... 438/155

FOREIGN PATENT DOCUMENTS

WO    WO03/023469 A1   3/2003
WO    WO03/023476 A1   3/2003

* cited by examiner

METHOD OF FORMING A SEMICONDUCTOR DEVICE

BACKGROUND

The present embodiments relate to a method of forming different devices types on the same integrated circuit, and more particularly to integrating non-MOS transistor devices with CMOS devices on the same integrated circuit.

As semiconductor processes and lithography continue to improve, transistor switching speeds continue to improve, which results in higher performance circuit functions. The circuits provide their outputs to other circuits. Often buses that are relatively long carry these signals. These buses inherently have capacitance and resistance so that an RC delay is present for an electrical signal being carried by the bus. The buses can be made bigger to reduce the resistance but that can also increase capacitance. Also there can be a great number of buses so that increasing bus size can cause the size of the integrated circuit to increase as well. The net effect is that the carrier of the signal is often a major speed limitation. Thus, additional increases in transistor switching speed can result in relatively small increases in overall speed of operation. Furthermore, the need to integrate a multitude of different device types (such as, RF, bipolar, and photonic enabled devices) on broad reaching CMOS platform technologies are desirable for low-cost manufacturing integration.

One difficulty has been finding a practical way to take advantage of multiple device integration for improved signal routing or increased integrated circuit functionality. One major issue is the integration of dissimilar device types on an integrated circuit chip in a manner that is manufacturable and consistent with transistor manufacturing considerations. The considerations are different for the two type devices and either device can become marginally functional or prohibitively expensive.

Furthermore, discrete non-MOS transistor components are often high cost components. While integrating non-MOS transistor devices on silicon can provide a low-cost solution, examples of such devices which have been demonstrated in single SOI are subject to imperfections in the manufacturing process, such as, geometry non-uniformity and imprecise dopant profiles in what can be complex 3-dimensional geometries. Such geometry non-uniformity can induce variations in device characteristics and thus degrade a desired device performance.

Many non-MOS transistor devices are based upon a diode or a series of diodes. Examples of non-MOS transistor devices include, but are not limited to, a bipolar transistor, an RF device, a photonic enabled device. The electrical properties of the diode influence the performance of the non-MOS transistor device. However, precise location of the dopants within the diode are necessary across the wafer to improve manufacturing yields of such a device. Furthermore, non-MOS transistor devices may have different requirements on geometries other than what is required for high performance CMOS. RF device and photonic enabled device performance, for example, is very geometry dependent per device type. However, the standard high performance CMOS flow for making CMOS devices is inadequate for processing such non-MOS transistor devices.

Accordingly, it would be desirable to provide an improved method for integrating non-MOS transistor devices with CMOS electronic devices on the same integrated circuit allowing for high yields at the desired performance levels. In addition, it would be desirable to provide a method for manufacturing a non-MOS transistor device for overcoming the problems in the art.

SUMMARY

According to one embodiment of the present disclosure, a method of forming a non-MOS transistor device on SOI comprises using a CMOS compatible process incorporating a dual-trench integration scheme. The dual-trench integration scheme is used to form multiple trench depths and subsequent implantation into one or more of the trenches. Additionally, the dual-trench integration scheme allows for complete device isolation in a planar SOI process which is fully integrate-able with CMOS processing.

BRIEF DESCRIPTION OF THE DRAWINGS

The embodiments of the present disclosure are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
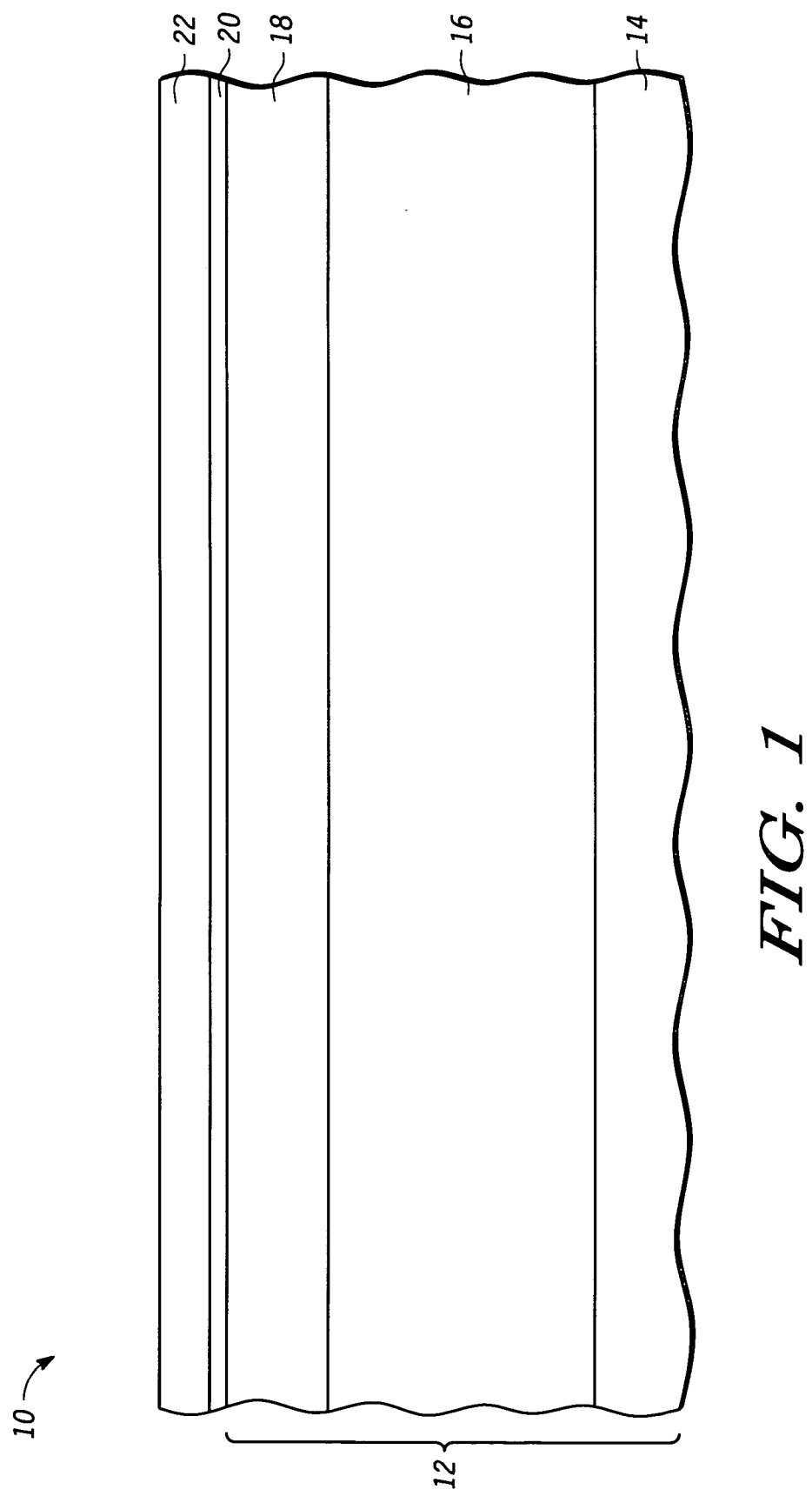
FIG. 1 is a cross-sectional view of a portion of a semiconductor device useful in understanding a method to forming a non-MOS transistor device according to one embodiment of the present disclosure.

FIG. 1 is a cross-sectional view of a portion of a semiconductor device 10 useful in understanding a method to forming a non-MOS transistor device according to one embodiment of the present disclosure. The semiconductor device 10 could include, but not be limited to, an RF/electronic integrated circuit, a photonic enabled integrated circuit, or an analog/digital hybrid integrated circuit, for example. The method begins with a semiconductor-on-insulator (SOI) substrate with a pad oxide and an anti-reflective coating (ARC)/hard mask layer overlying the SOI substrate. In particular, SOI substrate 12 includes a semiconductor substrate 14, buried oxide layer 16, and a semiconductor layer 18. Furthermore, pad oxide layer 20 overlies the semiconductor layer 18. Lastly, anti-reflective coating/hard mask layer 22 overlies the pad oxide layer 20. The overlying two films are typically grown or deposited during the first stages in a conventional CMOS process.

In one embodiment, semiconductor substrate 14 comprises a silicon substrate. In addition, buried oxide layer 16 comprises, for example, an oxide layer having a thickness determined according to the requirements of a particular integrated circuit application. For example, a typical range of thicknesses of the oxide layer for electronic devices is on the order of 1400–2000 angstroms. For photonic enabled device applications, the thickness of the oxide layer can be on the order of 8,000 angstroms or greater. Furthermore, semiconductor layer 18 can comprises a silicon layer having a desired thickness determined according to the requirements of a particular integrated circuit application. For example, a range of thicknesses of the silicon layer for electronic devices can be on the order of up to 1000 angstroms or greater. For photonic enabled device applications, the thickness of the silicon layer can be, for example, on the order of 2,000 angstroms or greater. The desired thickness of layers 16 and 18 are selected according to the requirements of a particular non-MOS transistor device. In another embodiment, the active semiconductor layer 18 can comprise one of: (i) a top semiconductor layer of a semiconductor-on-insulator substrate, or (ii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried insulator; or (iii) a top semiconductor layer overlying a second semiconductor layer, and the second semiconductor layer overlying a bottom semiconductor layer, wherein the second semiconductor layer is lattice matched to the bottom semiconductor layer, and the bottom semiconductor layer overlying a buried insulator.

Referring still to FIG. 1, pad oxide 20 provides a stress relief oxide layer. In addition, ARC/hard mask layer 22 provides a two fold purpose. In one purpose, the ARC assists with trench photolithography, as discussed further herein. In a second purpose, hard mask assists with trench etch, as discussed further herein. The ARC/hard mask layer 22 can comprise, for example, a nitride or a silicon rich nitride layer.

Figure 2:
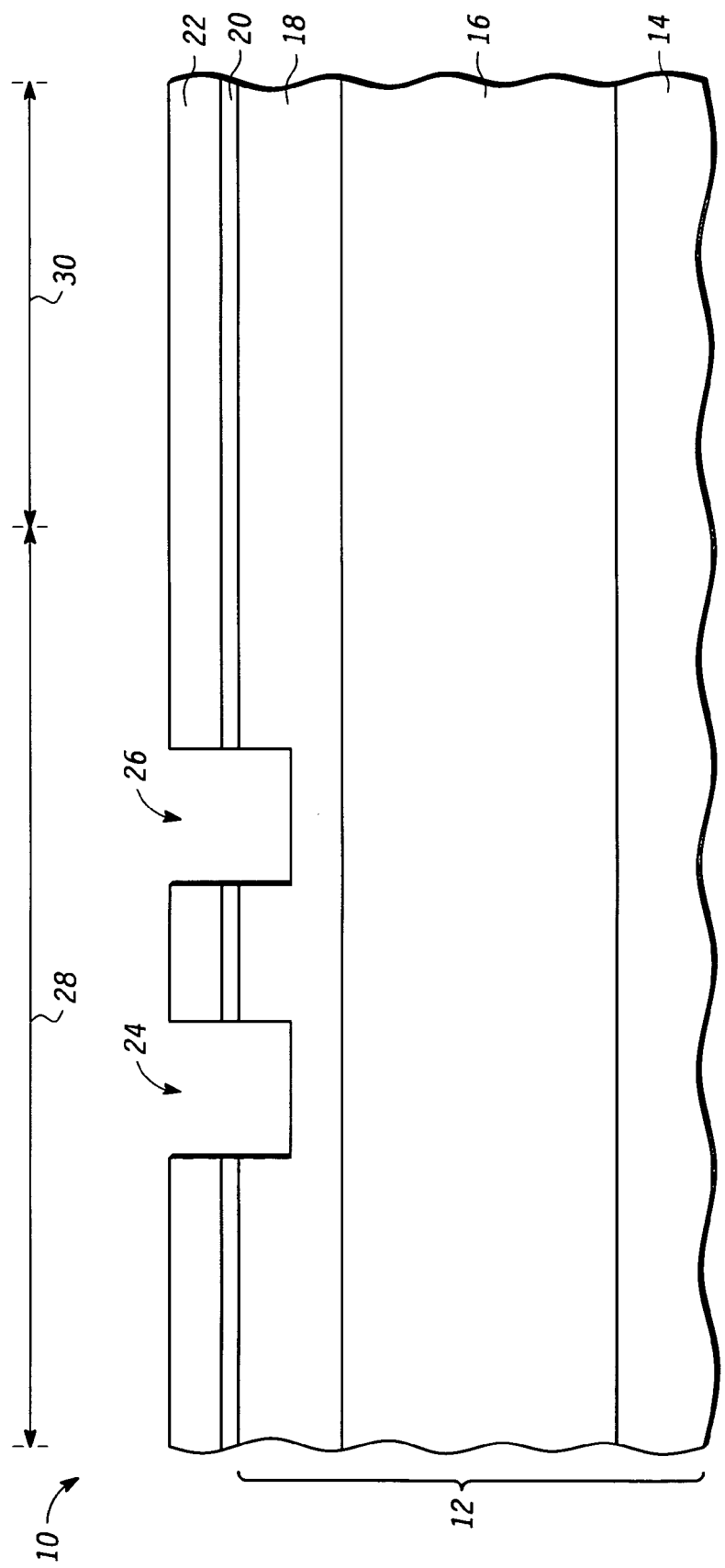
FIGS. 2–11 are cross-sectional views of portions of the semiconductor device during a manufacturing process thereof, according to the various embodiments of the present disclosure.

Referring now to FIG. 2, a first trench etch (or shallow trench etch) is performed using standard trench etch techniques, for example, reactive ion etching. The first shallow trench etch forms shallow trenches 24 and 26 within layers 18, 20, and 22 of non-MOS transistor portion 28 of the semiconductor device 10 integrated circuit (IC). During processing of the non-MOS transistor portion 28, the CMOS electronic device portion 30 is protected from processing, for example, by a suitable protection layer or layers. Note that the first shallow trenches 24 and 26 do not fully extend through semiconductor layer 18. In one embodiment, the top portion of semiconductor layer 18 remaining between shallow trenches 24 and 26, within the non-MOS transistor device portion 28 of the semiconductor device 10, represents a portion of a photonic enabled device, such as an optical modulator. In another embodiment, the top portion of semiconductor layer 18 remaining between shallow trenches 24 and 26, within the non-MOS transistor device portion 28 of the semiconductor device 10, represents a portion of a bipolar transistor, such as a lateral bipolar transistor.

Figure 3:
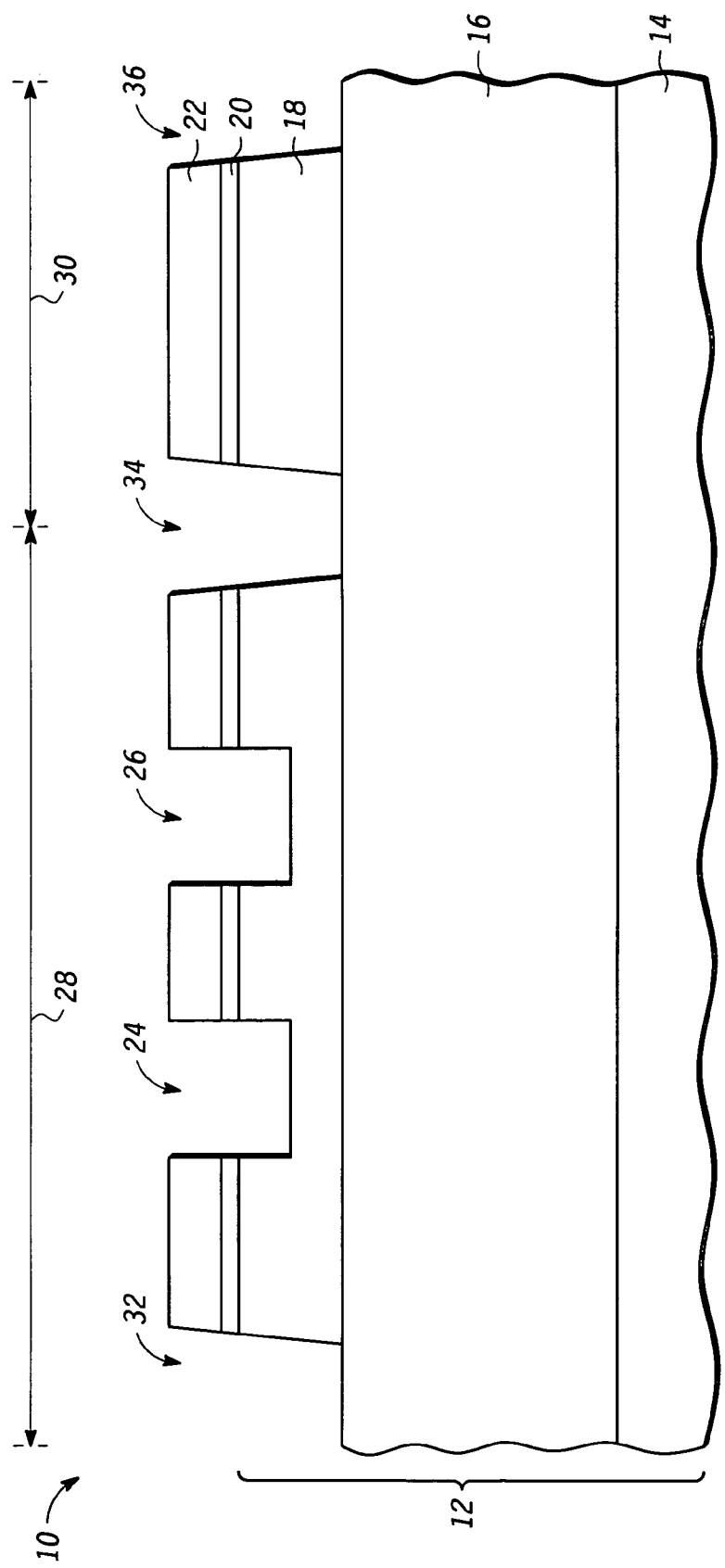

Turning now to FIG. 3, a second trench etch (or deep trench etch) follows the first trench etch. In particular, the second trench etch forms deep trenches 32, 34, and 36. Deep trenches 32, 34, and 36 can be formed with a multi-step etch, going through the nitride layer 22, pad oxide layer 20, the semiconductor layer 18, and end-pointing on the buried oxide 16. The deep trenches are formed in both the non-MOS transistor portion 28 and the CMOS electronic device portion 30 of the IC. Deep trenches provide for electronic isolation between desired devices, whether non-MOS transistor devices or CMOS electronic devices. In the CMOS electronic device portion 30 of the semiconductor device 10, the semiconductor layer 18 represents a portion of a CMOS electronic device formed between deep trenches 34 and 36, for example, an active region.

Figure 4:
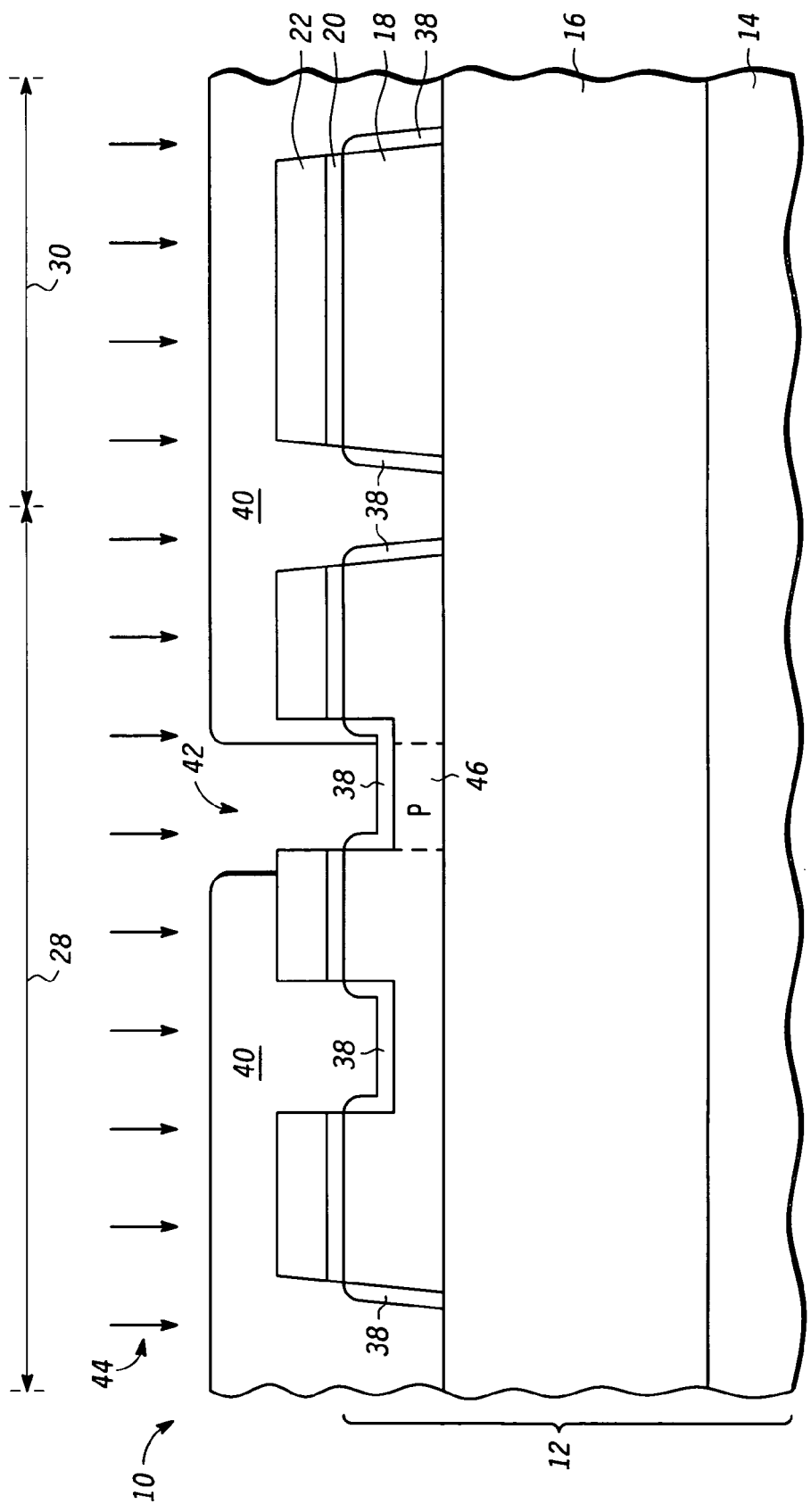

Referring to FIG. 4, following the formation the shallow trenches (24,26) and deep trenches (32,34,36), trench liners 38 are formed along sidewalls and bottoms of the shallow trenches (24,26) and formed along sidewalls of the deep trenches (32,34, 36). In one embodiment, trench liners 38 are formed through a furnace oxidation. Alternatively, the trench liners on the non-MOS transistor device portion 28, also referred to herein as non-MOS transistor liners, could be formed independently of the trench liners on the CMOS electronic device portion 30, as may be desired for obtaining separate non-MOS transistor and CMOS electronic device performance and reliability characteristics, respectively, according to the particular requirements of a given semiconductor device 10 integrated circuit application. For example, in one embodiment, forming the non-MOS transistor liner comprises the use of an oxidation process optimized to provide a reduction in sidewall roughness to optimize and reduce loss in a phonic enabled device. In another embodiment, forming the trench liner comprises an oxidation process optimized to passivate the sidewalls, and to optimize a stress in the active semiconductor layer between the openings of the active semiconductor layer in the CMOS electronics device portion of the semiconductor substrate, or the non-MOS transistor device portion, wherein the non-MOS transistor device is something other than a photonic enabled device.

In addition, the method includes performing a first portion of non-MOS transistor device implants or doping. In this first portion of non-MOS transistor device implants, a photoresist 40 is formed overlying the non-MOS transistor device and CMOS electronic device portions (28 and 30) of the semiconductor device 10. The photoresist 40 can include, for example, any suitable photoresist, multi-layer resist, or resist/anti-reflection-coating stack. Subsequently, an opening 42 is formed in the photoresist 40, over at least a portion of a first shallow trench within the non-MOS transistor device portion 28 of the semiconductor device 10. The first shallow trench can include, for example, trench 26 of FIG. 3. In one embodiment, the opening 42 exposes a portion of a bipolar transistor device to be formed within the non-MOS transistor device portion 28 of the semiconductor device 10. In another embodiment, the opening 42 exposes a portion of a photonic enabled device to be formed within the non-MOS transistor device portion 28 of the semiconductor device 10.

Subsequent to forming the opening 42, the semiconductor device 10 is subjected to a first conductivity type implant species, indicated by reference numeral 44. The implant provides a resultant implanted region 46 within a portion of semiconductor layer 18 underlying shallow trench 26. In one embodiment, the first conductivity type implant species is p-type and the implanted region 46 is a P region. The implant could be a single implant or series of implants performed either with a single pattern or multiple patterning steps, as determined according to the device requirements for the device formed within non-MOS transistor device portion 28. During implantation of region 46, the unexposed portions of the non-MOS transistor device and the CMOS electronic device portions 28 and 30, respectively, of the semiconductor device 10 are protected from implantation by photoresist 40. In addition, subsequent to formation of region 46, the remaining photoresist 40 can be stripped using standard techniques.

Figure 5:
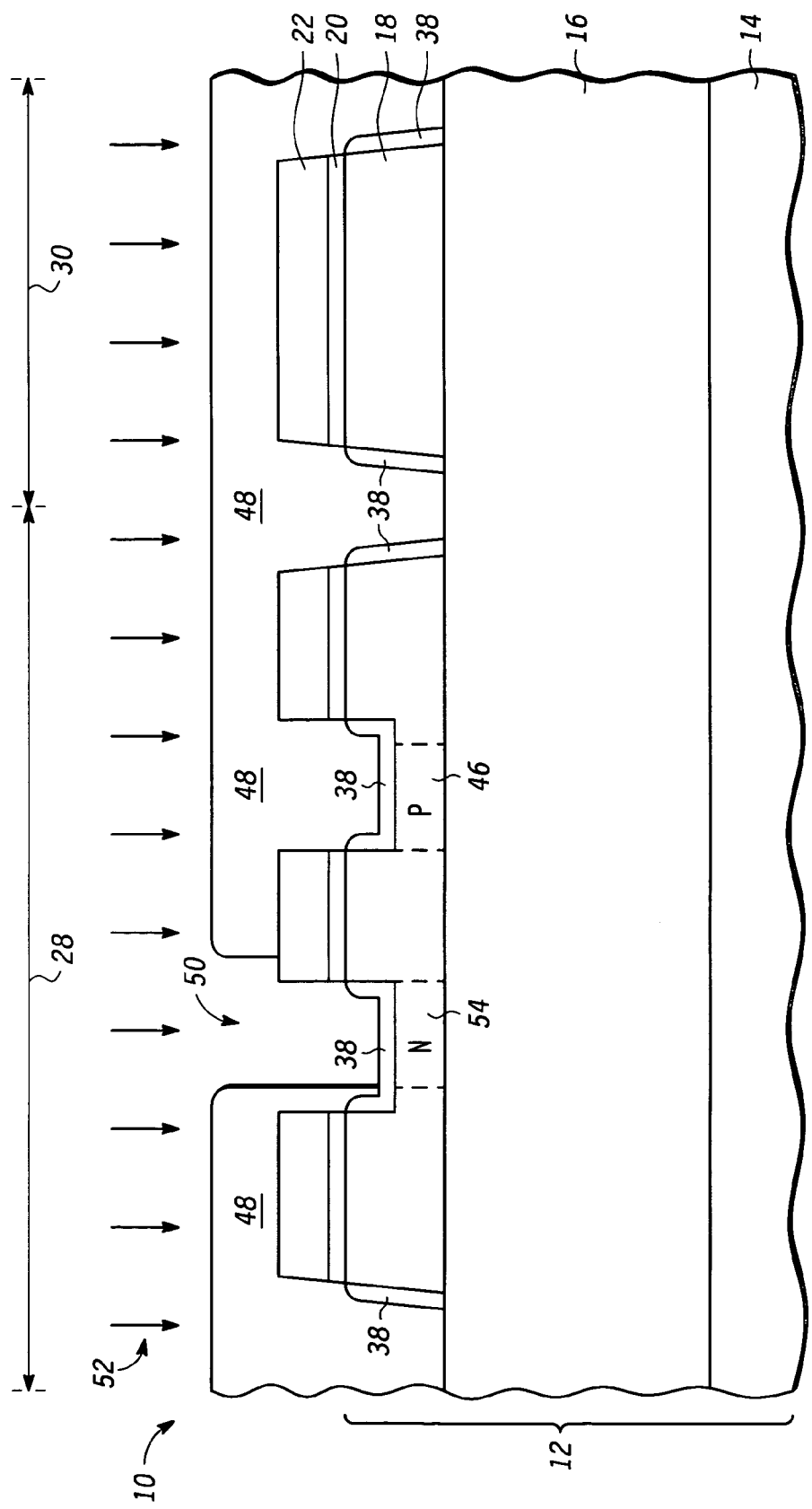

Referring now to FIG. 5, the method further includes performing a second portion of non-MOS transistor device implants or doping. In this second portion of non-MOS transistor device implants, a photoresist 48 is formed overlying the non-MOS transistor device and CMOS electronic device portions (28 and 30) of the semiconductor device 10. The photoresist 48 can include, for example, any suitable photoresist, multi-layer resist, or resist/anti-reflection-coating stack. Subsequently, an opening 50 is formed in the photoresist 48, over at least a portion of a second shallow trench within the non-MOS transistor device portion 28 of the semiconductor device 10. The second shallow trench can include, for example, trench 24 of FIG. 3. In one embodiment, the opening 50 exposes a portion of a bipolar transistor device to be formed within the non-MOS transistor device portion 28 of the semiconductor device 10. In another embodiment, the opening 50 exposes a portion of a photonic enabled device to be formed within the non-MOS transistor device portion 28 of the semiconductor device 10.

Subsequent to forming the opening 50, the semiconductor device 10 is subjected to a second conductivity type implant species, indicated by reference numeral 52. The implant provides a resultant implanted region 54 within a portion of semiconductor layer 18 underlying shallow trench 24. In one embodiment, the second conductivity type implant species is n-type and the implanted region 54 is an N region. The implant could include a single implant or series of implants performed either with a single pattern or multiple patterning steps; as determined according to the device requirements for the device formed within non-MOS transistor device portion 28. During implantation of region 54, the unexposed portions of the non-MOS transistor device and the CMOS electronic device portions 28 and 30, respectively, of the semiconductor device 10 are protected from implantation by photoresist 48. In addition, subsequent to formation of region 54, the remaining photoresist 48 can be stripped using standard techniques. As discussed herein, the implant may also include multiple implants. In addition, the geometry of the opening may extend onto the adjacent active layer in order to place dopant into that area to provide electrical connectivity. Accordingly, the patterning can be flexible in accordance with the requirements of a particular device or devices.

In one embodiment, such implants can be configured to be the base contact of a bipolar transistor. In other embodiments, the implants can be configured according to the requirements of one or more of a multitude of electronic or photonic enabled devices having a need for precise dopant control and/or a buried contact. While the discussion has mentioned two different conductivity types for regions 46 and 54, it should be noted that in an alternative embodiment the same conductivity type implant could be used for each of regions 46 and 54.

Figure 6:
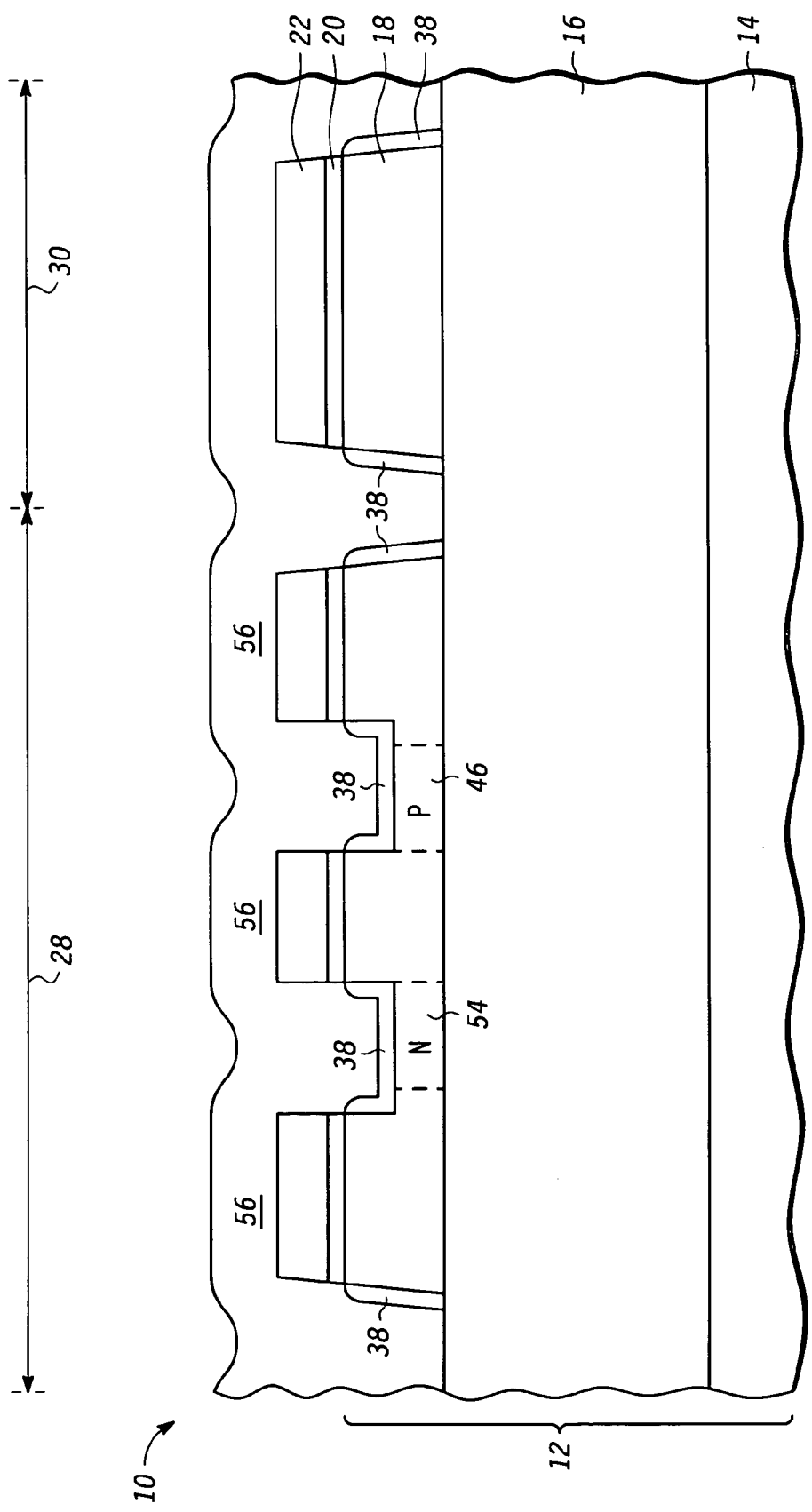

Referring now to FIG. 6, subsequent to formation of region 54 and removal of remaining photoresist 48, a trench fill material 56 is formed overlying the non-MOS transistor device and the CMOS electronic device portions 28 and 30, respectively. Trench fill material 56 fills the shallow trench (24,26) and deep trench (32,34,36) openings. In one embodiment, trench fill material 56 includes deposition of TEOS oxide, HDP (high density plasma) oxide, or other suitable trench fill material, such as a furnace oxide. Trench fill material 56 is selected to provide a desired device property. In one embodiment comprising a photonic enabled device, the trench fill material 56 can comprise a material having a lower index of refraction than an index of refraction of the underlying semiconductor layer 18. In another embodiment, the fill material 56 may be selected for its electrical and/or thermal insulating properties, or stress inducing properties, or for its ability to provide stress relief, as may be required for a particular non-MOS transistor device application.

Figure 7:
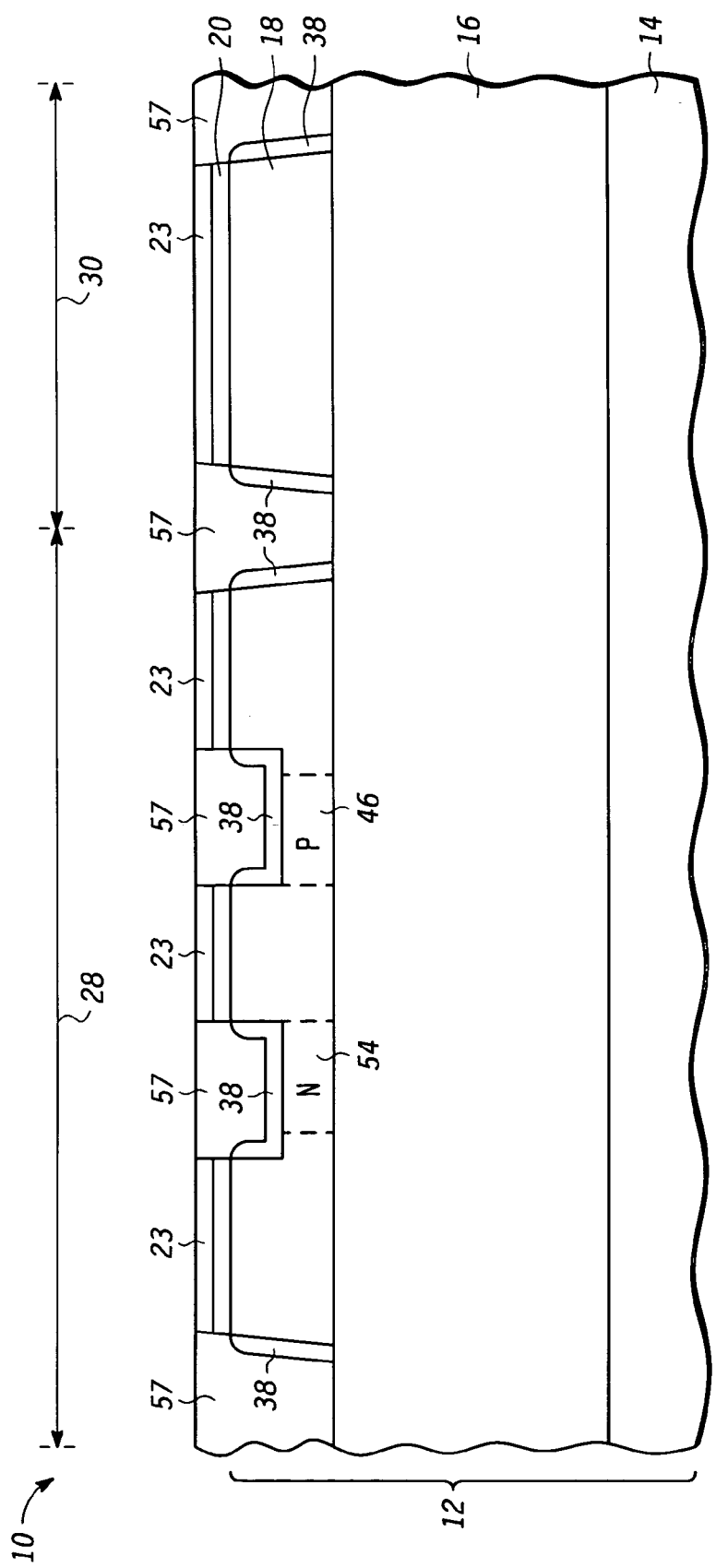

Referring now to FIG. 7, the semiconductor device 10 IC is planarized, for example, using a chemical-mechanical planarization (CMP) technique or other suitable planarization techniques. Planarization produces remainder portions 23 of the ARC/hard mask film 22. In addition, planarization further produces remainder portions 57 of the fill material 56. In one embodiment, ARC/hard mask film 22 comprises a nitride.

Figure 8:
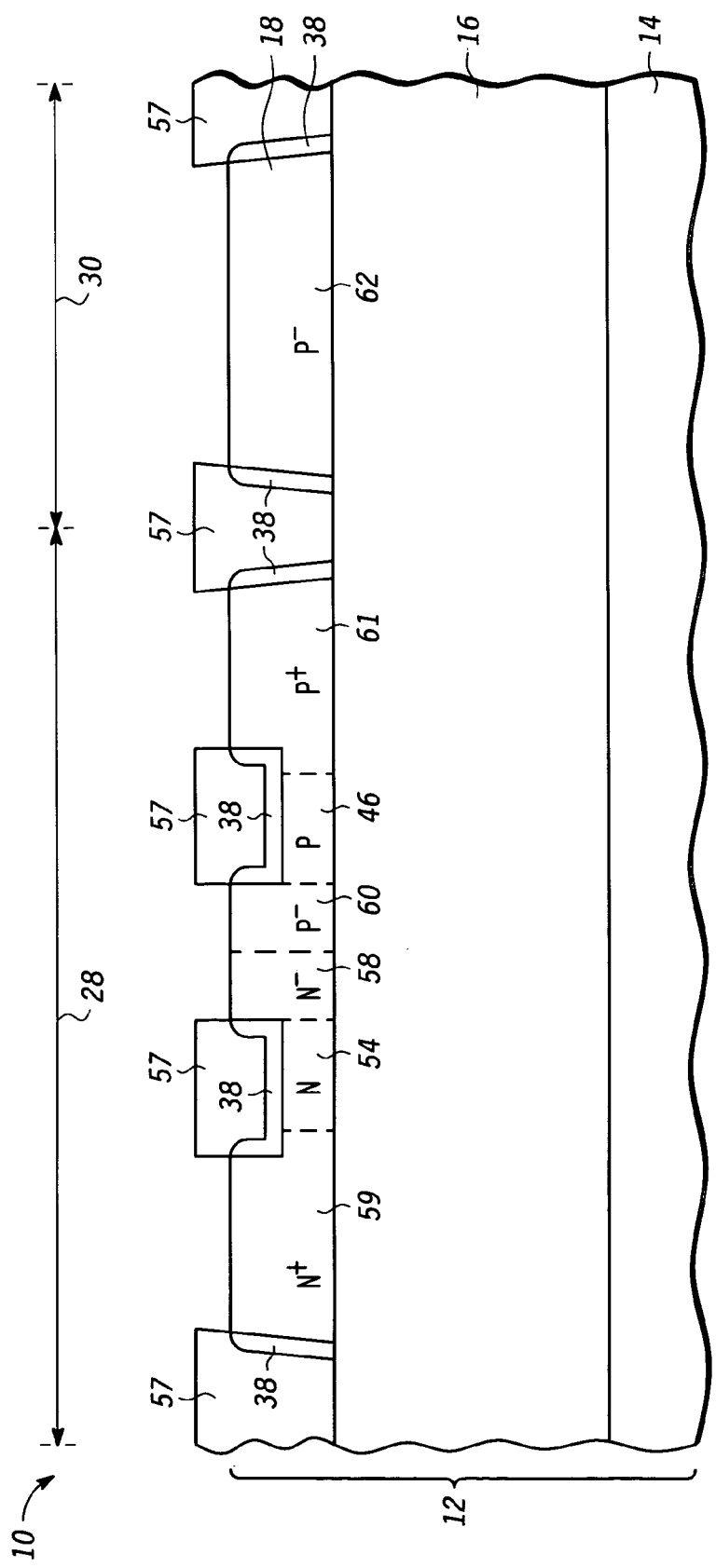

Removal of the remainder portions 23 of the ARC/hard mask film follows the planarization step, providing a structure as shown in FIG. 8. In one embodiment, removal of the remainder portions 23 includes a nitride strip. Following removal of the remainder portions 23, the process includes first and second low dose non-MOS transistor device well implants patterned by standard photolithographic techniques to form a generic diode in one embodiment. That is, the first low dose implant, or series of implants, includes an implant of the first conductivity type that forms P− well region 60 for the non-MOS transistor device within portion 28. In addition, the second low dose implant includes an implant of the second conductivity type that forms N− well region 58 for the non-MOS transistor device within portion 28. Furthermore, the low dose well implant can include implantation of a desired conductivity type for a transistor FET well 62 for the CMOS electronic device portion 30 of the semiconductor device 10 IC with either a concurrent or separately patterned implantation. For example, semiconductor layer portion 62 can include a P− region, as illustrated, and can be formed either simultaneously with or separately patterned from the formation of the P− well region 60. In another embodiment, the semiconductor layer portion 62 could include an N− region, formed either simultaneously with or separately patterned from the formation of the N− region 58, as may be desired for the particular requirements of a transistor to be formed within the non-optical portion 30 of the semiconductor device 10 IC. As discussed herein, the implant may also include multiple implants.

Furthermore, following low dose implants, the process includes first and second high dose non-MOS transistor device connectivity implants. That is, the first high dose connectivity implant includes an implant of the first conductivity type that forms P+ region 61 for the non-MOS transistor device within portion 28. In addition, the second high dose connectivity implant includes an implant of the second conductivity type that forms N+ region 59 for the non-MOS transistor device within portion 28. Each high dose connectivity implant could include a single implant or series of implants performed either with a single pattern or multiple patterning steps, similarly as discussed herein, or as determined according to device requirements for the non-MOS transistor device formed within non-MOS transistor device portion 28. In addition, the high dose implant dosage is greater than an implant dosage of the low dose implant. Following the high dose implantations, the pad oxide overlying the remaining portions of semiconductor layer 18 is stripped, for example, using a standard oxide strip. Those skilled in the art will note that the oxide-silicon step height is exaggerated for the sake of illustration and that a single or series of oxidations prior to and following well formation are often used (but not illustrated in the figures) in a CMOS process flow which address this step height while simultaneously tuning the CMOS electronic and non-MOS transistor properties of devices formed within regions 30 and 28, respectively.

In the examples of the above discussion, the low dose and high dose implants form electrical contacts to a PN junction diode. In one embodiment, such low dose and high dose implants can be configured to be portions of a bipolar transistor. In other embodiments, the implants can be configured according to the requirements of one or more of a multitude of electronic or photonic enabled devices. While the discussion has mentioned two different conductivity types for the low dose and high dose regions (58,60) and (59,61), respectively, it should be noted that in an alternative embodiment the same conductivity type implant could be used for each of these regions.

Figure 9:
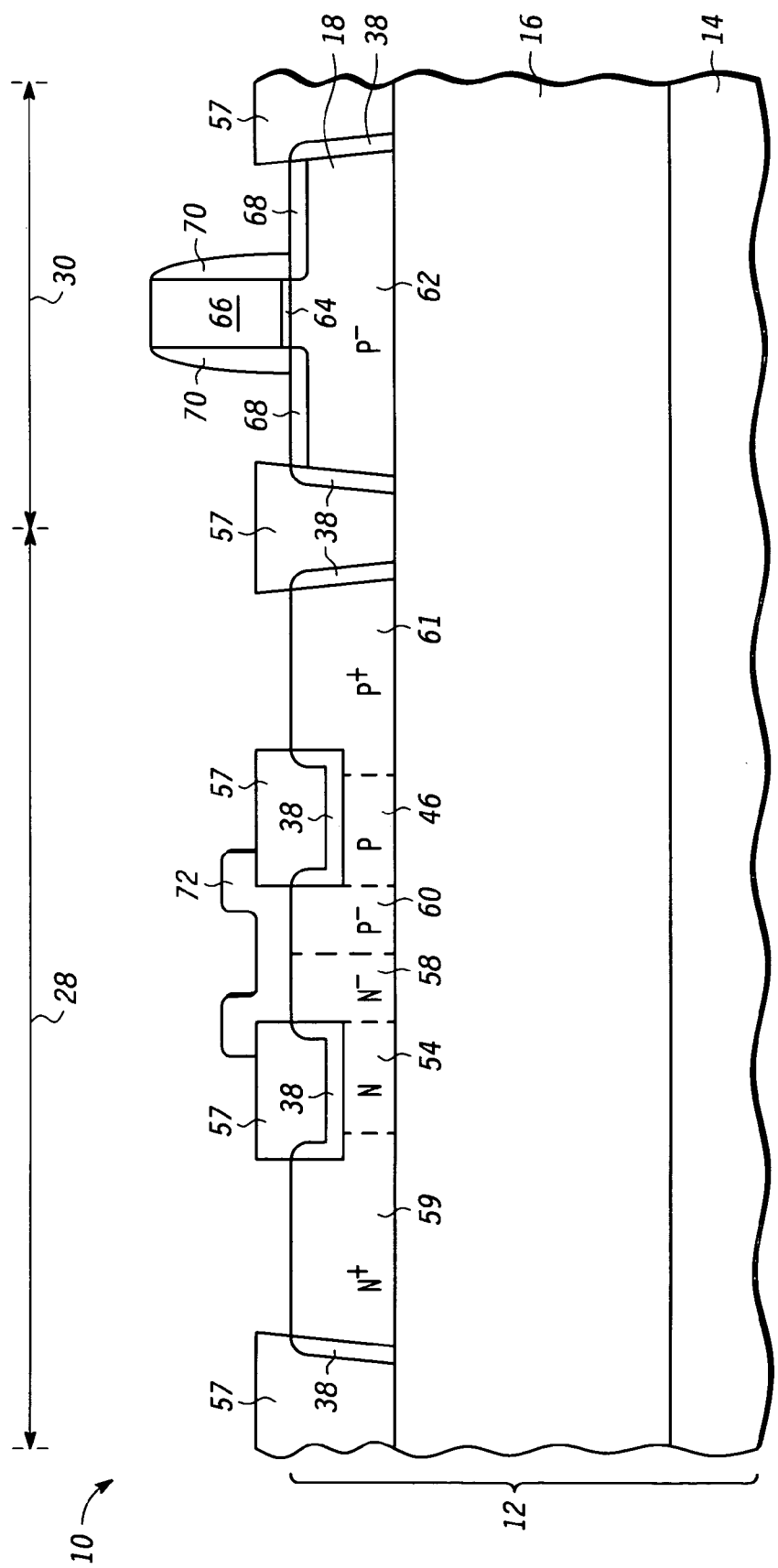

Turning now to FIG. 9, the fabrication process further includes formation of a gate dielectric, gate electrode, and spacer/salicide block formation. Subsequent to the oxide strip discussed above with respect to FIG. 8, a gate dielectric 64 is formed for a transistor device to be formed within the CMOS transistor device portion 30 of the semiconductor device 10. The gate dielectric 64 can include, for example, an oxide or other dielectric selected according to the requirements of a particular CMOS transistor device application. Following gate dielectric formation, a gate electrode 66 is formed for the transistor. Extension implant regions 68 are then formed for the transistor. Subsequent to extension region implants 68, sidewall spacers 70 are formed for the transistor. Note that the gate dielectric, gate electrode, extension implant regions, and the sidewall spacers are selected according to the requirements of the particular transistor application. Furthermore, a salicide block 72, comprising, for example, the same material used to form sidewall spacers 70, can be patterned with photolithography and formed at the same time as sidewall spacers 70, according to the requirements of the non-MOS transistor device. Salicide block 72 is formed overlying at least regions 58 and 60 of the portion of the semiconductor layer 18 within the non-MOS transistor device portion 28 of the semiconductor device 10 IC. The salicide block 72 could also overly a portion of the planarized fill material 57 adjacent to regions 58 and 60. Alternatively, salicide block 72 could be formed independent of the formation of sidewall spacers 70. Salicide block 72 prevents an undesired salicidation of the portion of semiconductor layer 18 of the non-MOS transistor device formed between shallow trenches 24 and 26, during a salicidation of exposed semiconductor portions within the non-MOS transistor device and CMOS electronic device portions 28 and 30, respectively, of the semiconductor device 10 IC as discussed further herein below. In one embodiment, the non-MOS transistor device comprises a resistor, wherein the presence of a salicide is undesired due to the potential for modulation of electronic properties of the resistor as a result of the salicide. In another embodiment, the non-MOS transistor device comprises a photonic enabled device, wherein the presence of a salicide is undesired due to the potential for adverse modulation of optical properties of the photonic enabled device as a result of the salicide.

Figure 10:
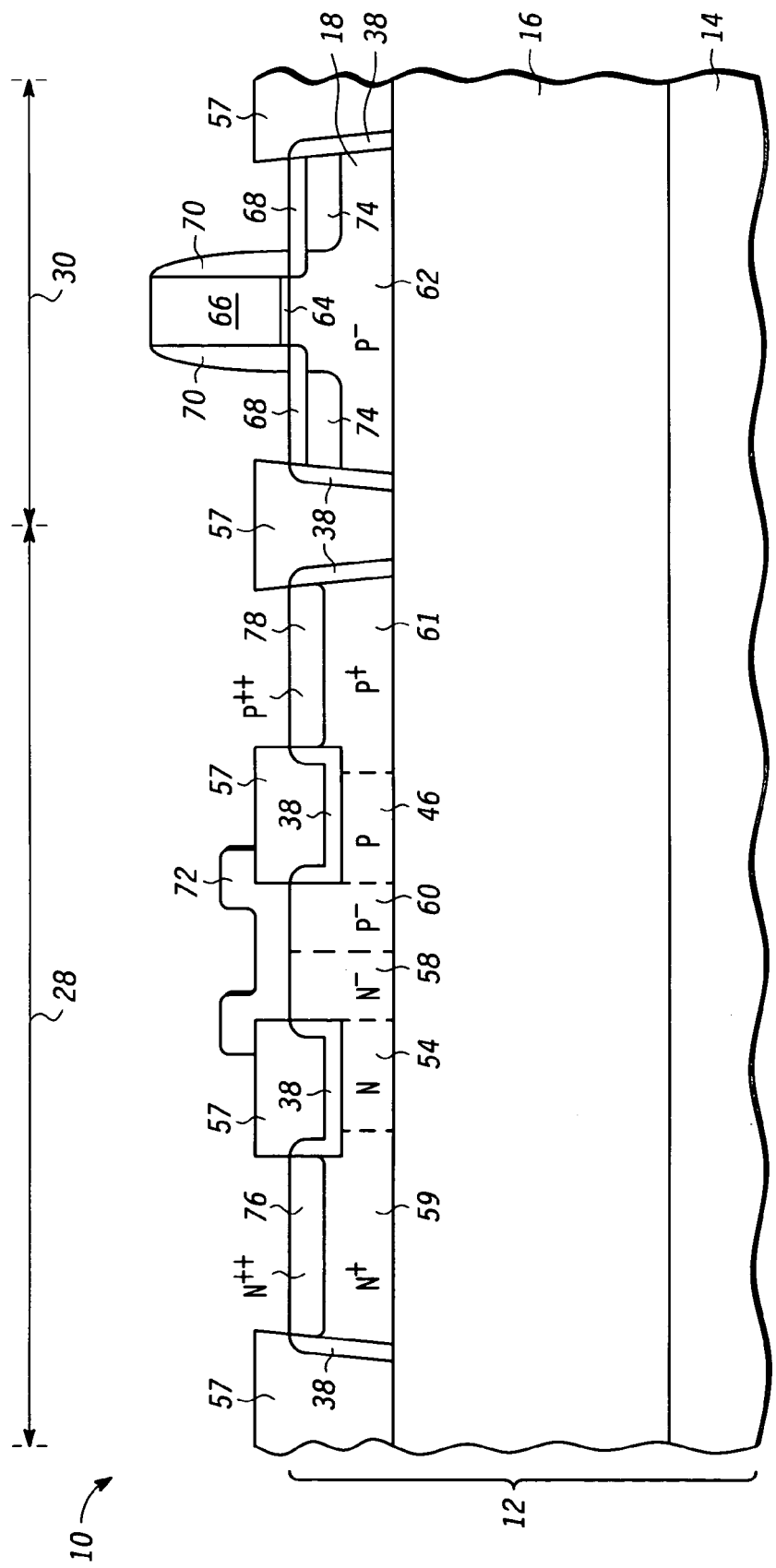

Following formation of the salicide block 72 within the non-MOS transistor device portion 28, non-MOS transistor device contact implants and CMOS electronic device source/drain (S/D) implants are performed, with reference to FIG. 10. In one embodiment, a first contact implant includes an implant of the first conductivity type that forms P++ contact region 78 for the non-MOS transistor device contact. In addition, a second contact implant includes an implant of the second conductivity type that forms N++ contact region 76 for the non-MOS transistor device contact. The first and second contact regions are implanted with respective implant dosages according to the requirements of the particular non-MOS transistor device application. In one embodiment, the implant dosage of the contact regions is greater than an implant dosage of the high dose connectivity regions. Furthermore, source and drain regions 74 are implanted for the CMOS electronic device according to the requirements of the particular CMOS electronic device application. For example, in one embodiment, source and drain regions 74 are implanted simultaneously with the formation of the N++ contact region 76. Furthermore, each contact implant could include a single implant or a series of implants performed either with a single pattern or multiple patterning steps.

Figure 11:
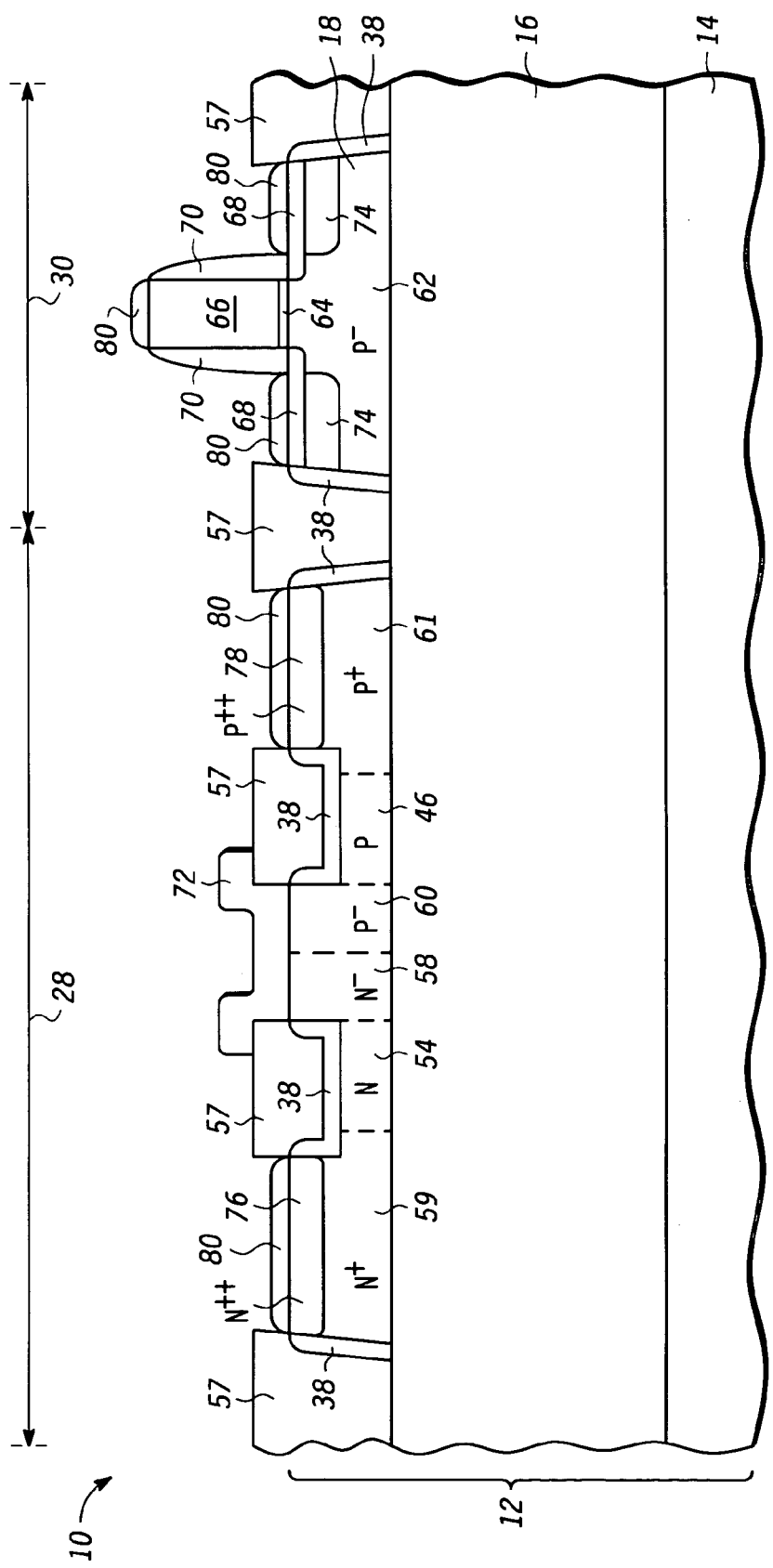

Referring now to FIG. 11, the semiconductor device 10 IC is further processed with salicidation of exposed portions of semiconductor material, using standard techniques. In particular, salicide regions 80 are formed in both the non-MOS transistor device portion 28 and the CMOS electronic device portion 30 of the integrated circuit. Note that the salicide block 72 prevents an undesired salicidation of the top portion regions 58 and 60 of the non-MOS transistor device during a salicidation of exposed semiconductor portions within portions 28 and 30, respectively, of the semiconductor device 10 IC. In addition, the salicide regions 80 formed within the non-MOS transistor device portion 28 form contact regions, as discussed further herein below. For example, in one embodiment, the salicide may include a deposition of Cobalt or Nickel with a Ti or TiN cap, with use of appropriate thermal reactive steps and etches to selectively form the salicide on top of exposed silicon regions.

Figure 12:
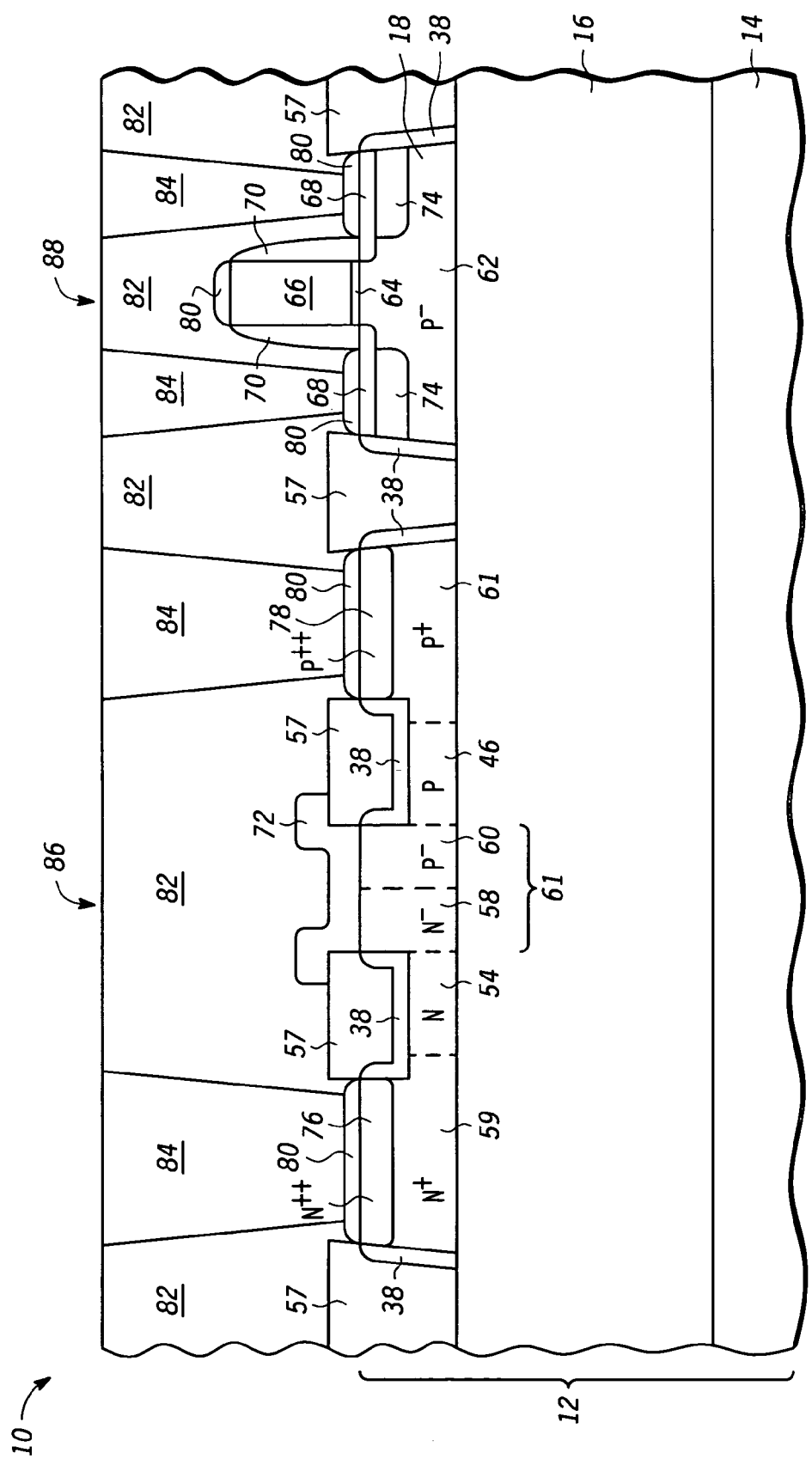
FIG. 12 is a cross-sectional view of the semiconductor device including a non-MOS transistor device as manufactured according to one embodiment of the present disclosure.

Referring now to FIG. 12, subsequent to formation of the salicide regions 80, an interlevel dielectric layer (ILD0) 82 is formed overlying the non-MOS transistor device portion 28 and CMOS electronic device portion 30 of the semiconductor device 10 IC. Formation of the ILD0 layer 82 can include, for example, deposition and planarization of low k TEOS, a single film, or a dielectric stack, as may be required for a particular semiconductor device application. Following formation of the ILD0 layer 82, appropriate contacts 84 are formed within the ILD0 layer 82 to respective ones of the non-MOS transistor device 86 and the CMOS electronic device 88. Contacts 84 can be formed, for example, by standard process of creating appropriate contact openings, filling the contact openings with a contact metallization, followed by planarization. Furthermore, as illustrated in FIG. 12, the salicide regions 80 formed within the non-MOS transistor device portion 28 form contacts that are disposed distal from the non-MOS transistor device as may be required according to the specific needs of the non-MOS transistor device. In one embodiment, the non-MOS transistor device comprises a resistor of a bipolar transistor, wherein the contacts can be spaced closer to the non-MOS transistor device, or extend into the adjacent shallow trenches to provide for reduced series resistance as may be required. In other embodiments, the non-MOS transistor device comprises a photonic enabled device, wherein sufficient separation of the contacts and an optical mode of the photonic enabled device is provided.

With respect to the non-MOS transistor device portion 28, in one embodiment, a composite of the salicide block layer 72 and the ILD0 layer 82 may provide for an upper cladding layer for the completion of a photonic enabled device. The non-MOS transistor device 86 includes the PN junction 61 formed by the N− region 58 and the P− region 60. In addition, as discussed herein, the CMOS electronic device 88 or transistor has been advantageously integrated on the same substrate as the non-MOS transistor device 86.

In one embodiment, the non-MOS transistor device 86 comprises a photonic enabled device, for example, an optical phase modulator. An appropriate modulation control signal can be applied across contacts 84 of the optical phase modulator to modulate the phase of a guided wave within the core of its waveguide. PN junction 61 contains a depletion region. Reverse biasing of the PN junction 61 modulates the size of the depletion region within the core of the waveguide. Modulating the size of the depletion region and/or carrier concentration changes the index of refraction of the waveguide. Alternately, forward biasing of the diode would inject a current that would also modulate the optical properties of the waveguide. Accordingly, the phase of the optical signal is modulated. In another embodiment, the non-MOS transistor device 86 comprises a buried resistor. In yet another embodiment, the non-MOS transistor device 86 comprises a bipolar transistor. An appropriate control signal can be applied across contacts 84 of the bipolar transistor to operate the bipolar transistor.

As discussed herein, the present embodiments provide methods for manufacturing high quality non-MOS transistor devices. The wafer can comprise, for example, a silicon-on-insulator (SOI) wafer. In addition, the methods provide steps for improving the manufacturability of non-MOS transistor devices with CMOS electronic devices. Furthermore, the methods of the present embodiments are compatible with standard CMOS silicon processes used extensively in manufacturing today. Moreover, the methods are scalable with the continued scaling of CMOS technology. Still further, the methods of the present embodiments enable the integration of non-MOS transistor devices and CMOS electronic devices on a single silicon chip. Furthermore, the utilization of into-trench non-MOS transistor implants allows a very repeatable means of achieving a consistent dopant profile across-wafer or wafer-to-wafer. Otherwise, without the into-trench implants, the wells would have to be implanted through a field oxide, the thickness of which may vary considerably across the surface of the wafer.

Furthermore, in one embodiment, the method takes advantage of the low cost of silicon planar processing to form an optical phase modulator, wherein such a modulator can be used as one arm of an interferometer or amplitude modulator. Light can be coupled into the modulator using an integrated waveguide running parallel to the silicon's surface. The waveguide passes through a diode which, when biased, modulates the index of refraction of the waveguiding material. Modulating the index of refraction thus alters the output phase of the light. Still further, according to the present embodiments, SOI provides for an optical waveguide and electronic integration, wherein silicon and $SiO_2$ films are stacked to have specific optical thin-film properties.

With the embodiments of the present disclosure, the lithography, ion implantation, and contact diffusions are self-aligned to the substrate contacts to create highly-repeatable diode characteristics suitable for volume manufacturing. Additionally, junction optimizing implants may be used to grade the junction. Moreover, the junction implants can be implanted before the corresponding trench is filled, thus providing for a low-energy, repeatable diffusion layer.

Accordingly, the embodiments disclosed herein provide one or more integrations that present low-cost methods for manufacturing non-MOS transistor devices of arbitrary dimension. Moreover, the methods enable the manufacturability of an optical phase modulator that is easily integrated with CMOS electronics, repeatable, and highly efficient.

The methods of the present embodiments can be used in a number of optoelectronic or RF device applications. In addition, the methods can be used to optically enable internal integrated circuit, module, or system level devices, such as enabling optical clock-tree routing or optical chip-chip interconnect. Still further examples include high end microprocessor devices, high end optical network communication devices, and replacements for optical passive elements.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for integrating a non-MOS transistor device and a CMOS electronic device on a semiconductor substrate, comprising:

providing a semiconductor substrate having an active semiconductor layer;

forming openings within the active semiconductor layer in a first region of the semiconductor substrate and openings within the active semiconductor layer in a second region of the semiconductor substrate, wherein the first region corresponds to a non-MOS transistor device portion of the semiconductor substrate and the second region corresponds to a CMOS electronic device portion of the semiconductor substrate, wherein forming includes using a dual trench process that includes forming the openings in the non-MOS transistor device portion to a first depth, and forming the openings in the CMOS electronic device portion to a second depth, the second depth being greater than the first depth;

forming a non-MOS transistor device liner on sidewalls, as well as on a bottom surface, of the openings of the first depth within the active semiconductor layer in the non-MOS transistor device portion of the semiconductor substrate;

forming a trench liner on sidewalls within the openings of the active semiconductor layer in the CMOS electronic device portion of the semiconductor substrate;

forming first and second non-MOS transistor device implant regions within portions of the active semiconductor layer underlying the first and second openings of the first depth, respectively, in the non-MOS transistor device portion, wherein the first and second openings of the first depth comprise respective first and second shallow trenches;

filling the openings of the active semiconductor layer in the non-MOS transistor device portion of the semiconductor substrate and the openings of the active semiconductor layer in the CMOS electronic device portion of the semiconductor substrate with a fill material and planarizing the fill material;

exposing a top surface portion of the active semiconductor layer disposed in-between the first and second shallow trenches in the non-MOS transistor device portion of the semiconductor substrate;

forming first and second low dose non-MOS transistor device well regions in respective first and second portions of the active semiconductor layer disposed in-between the first and second shallow trenches in the non-MOS transistor device portion of the semiconductor substrate;

forming first and second high dose non-MOS transistor device connectivity regions in respective third and fourth portions of the active semiconductor layer in the non-MOS transistor device portion of the semiconductor substrate;

forming at least a portion of a CMOS electronic device on the active semiconductor layer within the CMOS electronic device portion of the semiconductor substrate;

forming a salicide blocking layer overlying at least the first and second low dose non-MOS transistor device well regions in the non-MOS transistor device portion of the semiconductor substrate;

forming first and second non-MOS transistor device contact regions in top portions of respective third and fourth portions of the semiconductor layer in the non-MOS transistor device portion of the semiconductor substrate;

saliciding the electronic device portion and a portion of the non-MOS transistor device portion of the semiconductor substrate, wherein the salicide blocking layer prevents salicidation of the first and second low dose non-MOS transistor device well regions in the non-MOS transistor device portion of the semiconductor substrate; and forming an interlevel dielectric layer overlying the non-MOS transistor device portion and the CMOS electronic device portion of the semiconductor substrate.

2. The method of claim 1, wherein the first and second low dose well regions form a diode of the non-MOS transistor device.

3. The method of claim 1, wherein forming the non-MOS transistor device liners and forming the trench liners comprises one of: (i) simultaneously forming the non-MOS transistor device liners and the trench liners, or (ii) independently forming the non-MOS transistor device liners in the non-MOS transistor device portion from the trench liners in the electronic device portion.

4. The method of claim 1, wherein forming the first non-MOS transistor device implant region includes implantation of an implant species having a first conductivity type, and wherein forming the second non-MOS transistor device implant region includes implantation of an implant species having a second conductivity type.

5. The method of claim 1, wherein forming the first non-MOS transistor device implant region includes forming a photoresist overlying the non-MOS transistor device portion and the CMOS electronic device portion, forming an opening within the photoresist over at least a portion of the first shallow trench, and implanting a first conductivity type implant species into a portion of the semiconductor layer underlying the first shallow trench.

6. The method of claim 5, further wherein forming the second non-MOS transistor device implant region includes forming a photoresist overlying the non-MOS transistor device portion and the CMOS electronic device portion, forming an opening within the photoresist over at least a portion of the second shallow trench, and implanting a second conductivity type implant species into a portion of the semiconductor layer underlying the second shallow trench.

7. The method of claim 1, wherein forming the first low dose non-MOS transistor device well region includes implanting an implant species of a first conductivity type, and wherein forming the second low dose non-MOS transistor device well region includes implanting an implant species of a second conductivity type.

8. The method of claim 1, further wherein forming the first low dose non-MOS transistor device well region includes forming a photoresist overlying the non-MOS transistor device portion and the CMOS electronic device portion, forming an opening within the photoresist over at least a first portion of the semiconductor layer disposed in-between the first and second shallow trenches in the non-MOS transistor device portion, and implanting a first conductivity type implant species into the first portion of the semiconductor layer disposed in-between the first and second shallow trenches.

9. The method of claim 1, further wherein forming the second low dose non-MOS transistor device well region includes forming a photoresist overlying the non-MOS transistor device portion and the CMOS electronic device portion, forming an opening within the photoresist over at least a second portion of the semiconductor layer disposed in-between the first and second shallow trenches in the non-MOS transistor device portion, and implanting a second conductivity type implant species into the second portion of the semiconductor layer disposed in-between the first and second shallow trenches.

10. The method of claim 1, wherein forming the first high dose non-MOS transistor device connectivity region includes implanting an implant species of the first conductivity type, and wherein forming the second high dose non-MOS transistor device contact region includes implanting an implant species of the second conductivity type.

11. The method of claim 1, further wherein forming the first high dose non-MOS transistor device connectivity region includes forming a photoresist overlying the non-MOS transistor device portion and the CMOS electronic device portion, forming an opening within the photoresist over at least a third portion of the semiconductor layer adjacent one of the first and second shallow trenches, but not in-between the first and second shallow trenches in the non-MOS transistor device portion, and implanting the first conductivity type implant species into the third portion of the semiconductor layer.

12. The method of claim 11, further wherein forming the second high dose non-MOS transistor device connectivity region includes forming a photoresist overlying the non-MOS transistor device portion and the CMOS electronic device portion, forming an opening within the photoresist over at least a fourth portion of the semiconductor layer adjacent the other one of the first and second shallow trenches, opposite the third portion of the semiconductor layer, but not in-between the first and second shallow trenches in the non-MOS transistor device portion, and implanting the second conductivity type implant species into the fourth portion of the semiconductor layer.

13. The method of claim 1, wherein forming the non-MOS transistor device liner comprises an oxidation process optimized to provide a lowest loss waveguide as a function of a reduction in sidewall roughness.

14. The method of claim 1, wherein forming the trench liner comprises an oxidation process optimized to passivate the sidewalls, and to optimize a stress in the active semiconductor layer between the openings of the active semiconductor layer in the CMOS electronics device portion of the semiconductor substrate.

15. The method of claim 1, wherein forming the salicide blocking layer comprises depositing TEOS on the non-MOS transistor device portion and the CMOS electronic device portion of the semiconductor substrate and then removing the TEOS from the CMOS electronic device portion and the portion of the non-MOS transistor device portion outside the region of the first and second low dose non-MOS transistor device well regions.

16. The method of claim 1, wherein forming the salicide blocking layer comprises patterning the blocking layer to overlie the at least the first and second low dose non-MOS transistor device well regions of non-MOS transistor device portion of the semiconductor substrate.

17. The method of claim 1, wherein saliciding includes forming a salicidation metallization overlying the non-MOS transistor device portion and the CMOS electronic device portion of the semiconductor substrate, annealing the salicidation metallization to form salicided regions on exposed regions of semiconductor material within the CMOS electronic device portion of the semiconductor substrate, wherein the salicide blocking layer prevents salicidation of the salicidation metallization overlying the first and second low dose non-MOS transistor device well regions of the active semiconductor layer within the non-MOS transistor device portion of the semiconductor substrate.

18. The method of claim 1, wherein the active semiconductor layer comprises one of: (i) a top semiconductor layer of a semiconductor-on-insulator substrate, or (ii) a top semiconductor layer overlying a second semiconductor layer, the second semiconductor layer having an etch selectivity different from an etch selectivity of the top semiconductor layer, and the second semiconductor layer overlying a bottom semiconductor layer, the bottom semiconductor layer overlying a buried insulator; or (iii) a top semiconductor layer overlying a second semiconductor layer, and the second semiconductor layer overlying a bottom semiconductor layer, wherein the second semiconductor layer is lattice matched to the bottom semiconductor layer, and the bottom semiconductor layer overlying a buried insulator.

19. The method of claim 1, wherein the fill material includes one or more of TEOS, a furnace oxide, or a high density plasma oxide.

20. The method of claim 1, wherein the fill material comprises a material selected to provide a desired optical index of refraction.

21. The method of claim 20, further wherein the optical index of refraction of the fill material is less than an optical index of refraction of silicon.

22. The method of claim 1, wherein the portion of the CMOS electronic device comprises at least a gate dielectric and a gate electrode on the active semiconductor layer.

23. The method of claim 22, wherein the portion of the CMOS electronic device further comprises sidewall spacers adjacent sidewalls of the gate electrode.

24. The method of claim 23, wherein the portion of the CMOS electronic device further comprises source/drain regions proximate the gate electrode, gate dielectric, and sidewall spacers within the CMOS electronic device portion of the semiconductor substrate.

* * * * *